(12) United States Patent
Renner

(10) Patent No.: US 6,839,092 B2
(45) Date of Patent: Jan. 4, 2005

(54) FEED FORWARD ERROR CORRECTION IN VIDEO DECODER

(75) Inventor: Karl Renner, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 621 days.

(21) Appl. No.: 09/849,330

(22) Filed: May 4, 2001

(65) Prior Publication Data

US 2001/0043283 A1 Nov. 22, 2001

Related U.S. Application Data

(60) Provisional application No. 60/205,548, filed on May 22, 2000.

(51) Int. Cl.[7] .............................. H04N 9/45; H04N 9/445
(52) U.S. Cl. ....................... 348/505; 348/507; 348/536; 348/540; 375/376; 331/20; 327/154
(58) Field of Search ................................. 348/194, 505, 348/506, 507, 508, 509, 536, 537, 539, 540, 541, 542, 543, 544, 546, 549; 375/376; 331/20; 345/589; 327/154; H04N 9/45, 9/445

(56) References Cited

U.S. PATENT DOCUMENTS

| 4,291,332 | A | * | 9/1981 | Kato et al. ................... 348/539 |
| 4,694,326 | A | * | 9/1987 | Demmer ...................... 348/508 |
| 4,694,327 | A | * | 9/1987 | Demmer et al. ............. 348/508 |
| 5,068,717 | A | * | 11/1991 | Jenison ...................... 348/527 |
| 5,459,524 | A | * | 10/1995 | Cooper ....................... 348/507 |
| 5,757,688 | A | * | 5/1998 | Chen et al. .................. 708/653 |
| 6,038,276 | A | * | 3/2000 | Dinh .......................... 375/376 |
| 6,226,045 | B1 | * | 5/2001 | Vidovich .................... 348/539 |
| 6,317,161 | B1 | * | 11/2001 | Renner et al. .............. 348/536 |
| 6,329,850 | B1 | * | 12/2001 | Mair et al. .................. 327/107 |
| 6,330,034 | B1 | * | 12/2001 | Renner et al. .............. 348/536 |
| 6,366,327 | B1 | * | 4/2002 | Renner et al. .............. 348/558 |
| 6,380,980 | B1 | * | 4/2002 | Huang ........................ 348/505 |
| 6,445,252 | B1 | * | 9/2002 | Eilken et al. ................ 331/34 |
| 6,556,249 | B1 | * | 4/2003 | Taylor et al. ............... 348/497 |
| 2002/0047924 | A1 | * | 4/2002 | Huang ........................ 348/549 |

* cited by examiner

Primary Examiner—Brian P. Yenke
(74) Attorney, Agent, or Firm—J. Dennis Moore; W. James Brady, III; Frederick J. Telecky, Jr.

(57) ABSTRACT

In accordance with an embodiment of the present invention a microprocessor in the horizontal phased lock loop reads the horizontal timing with respect to the sync input and provides an increment $inc_h$ to the horizontal discrete time oscillator to make corrections in its timing to maintain lock to the sync input. The horizontal discrete time oscillator output is used to produce a pixel clock which drives the color discrete time oscillator in a color phased locked loop. A microprocessor reads a phase error between the color burst input and the color local oscillator frequency and writes an increment $inc_{sc}$ to the color discrete time oscillator to maintain lock to the color burst. The horizontal phase locked loop adjusts $inc_h$ that varies about nominal increment (nom__$inc_h$) by Δh. The feed forward error correction for the adjustment to the color discrete time oscillator is the nominal increment (nom__$inc_{sc}$) and a feed forwarded scaled version of Δh.

7 Claims, 1 Drawing Sheet

FEED FORWARD ERROR CORRECTION IN VIDEO DECODER

This application claims priority under 35 USC § 119(e)(1) of provisional application Ser. No. 60/205,548, filed May 22, 2000.

FIELD OF INVENTION

This invention relates to video decoders and more particularly to error correction in video decoders.

BACKGROUND OF INVENTION

The composite video signal sent from a video source includes color video information (which includes the chrominance signal conveyed by means of a subcarrier) as well as timing information for the accurate reproduction of the active video (e.g. reproduction of the picture information including its correct colors). This signal is essentially a video stream that combines, as a one signal, all of the elements required for displaying an image. The timing information is conveyed through the transmission of synchronization signals. A synchronization signal is commonly referred to as sync. In conjunction with a receiver which displays pixel information according to the video picture transmitted, an electric beam scans the receiver's display according to the horizontal sync signal followed by a horizontal blanking interval during which time the beam is shut off so that it can spot retrace horizontally across the display without being observed. Once the display has been scanned from top to bottom, the vertical sync signal determines when the beam is returned to the top of the display during the vertical blanking interval during which time the beam is shut off so that it can spot retrace vertically across the display without being observed. A composite video signal generally includes active video, horizontal sync, horizontal blanking, vertical sync, vertical blanking, and color burst. The color burst is that portion of the video waveform that sits between the breezeway (the portion of the video waveform between the rising edge of the horizontal sync and the start of the color burst) and the start of the active video. The color burst allows the color decoder to decode the color information contained in a line of active video. In a receiver or video decoder, the color phase locked-loop maintains lock of the local color oscillator with the color burst of the composite video input signal.

Conventional horizontal phase-locked loops for video decoders serve the purpose of locking the sampling clock, for clocking digital pixel information into the phase-locked loop, to the falling edge of the incoming horizontal sync of composite video information. This lock is required to generate a stable picture in the horizontal direction and position signals which identify the sync tip, back porch, and the color burst of the composite video. The analog video information enters an analog-to-digital converter which outputs digital pixel information. A pixel counter counts video information corresponding to pixels in what can be considered a horizontal scan line across a display monitor screen such as a cathode ray tube. The pixel counter starts with a count of zero and counts to a terminal count and then falls back to zero. The phase-locked loop employs two modes of lock; a coarse lock and a fine lock. In the coarse lock mode the incoming horizontal sync pulse which is usually present during the blanking interval of each line associated with the video signal (for the purpose of being able to synchronize the scanning of the monitor with the scanning of the original image), is detected by an analog circuit. Based on the decode of the pixel counter, a coarse gate filter window (meaning a relatively wide time window in comparison with the narrow time window associated with the fine window discussed below) is enabled around the time the horizontal sync pulse is expected. If the sync does not occur within the gate window for a time corresponding to several consecutive video lines, then either the pixel counter is reset or a correction is made to the clock frequency of the video decoder system in order to move the window to the sync pulse. When the sync pulse falls within the fine lock window, then the fine lock mode is enabled. A fine gate filter window is employed by the fine lock mode which enables a phase detector which calculates a phase error based upon the position of the edge of the sync pulse within a narrow window known as the fine lock window. This phase error is then filtered by a loop filter whose output is fed to a discrete time oscillator (DTO) which adjusts the clock frequency to move the sync pulse so that its edge is centered in the fine window, thereby minimizing the phase error. Prior art horizontal phase-locked loop schemes are generally implemented according to analog hardware, digital hardware or a combination of analog and digital hardware. A major drawback of this type of implementation lies in the inconvenience of changing parameters to adapt to a particular video scheme, e.g. NTSC, PAL, NPAL, MPAL, etc.

A digital version of the horizontal phase locked loop is described in application Ser. No. 09/126,630 filed Jul. 30, 1998 of Karl Renner et al. entitled "Horizontal Phased-Locked Loop for Video Decoder" and now abandoned. This application is incorporated herein by reference.

A digital version of the color oscillator in video decoder is called a color discrete time oscillator (DTO). The color phase lock loop is normally controlled by generating the phase error between the color burst input and the locally generated color frequency. The phase error is computed during the color burst interval by accumulating the product of the color burst input pixels and the cosine of the local color oscillator $\cos w_{sc}t$. The phase error is then filtered and added to a nominal color DTO increment value and then written to the color DTO. This occurs once per scan line. The phase error may also be accumulated in a register such that any frequency offset may be detected and added to the color DTO increment. This technique works fine if the pixel clock frequency is stable. Wide deviations can occur in nonstandard video such as television games. The video cassette recorder (VCR) is another source of nonstandard video. In the case of the VCR, head switching transience can cause the horizontal sync frequency to jump by as much as 16 microseconds during the vertical sync interval. However, should the pixel clock frequency vary (as it can with VCR inputs), problems can arise in efforts to accurately reproduce color content on a display. A microprocessor based system is needed in order to provide a highly adaptable and improved horizontal phase-locked loop as well as an improved color phase-locked loop.

The frequency and phase of the color DTO is controlled by an increment value written to it by a microprocessor. The color DTO is clocked by the pixel (picture element) sampling clock. The color phase lock loop (PLL) must be able to lock to the color burst frequencies. Since the color burst frequencies can deviate from the nominal frequency, the horizontal phase lock loop (PLL) must make coarse corrections in its timing in order to maintain lock to this input. Since the color DTO is clocked by the pixel clock, corresponding coarse correction must be made to it such that the stability of the local color oscillator is maintained and color lock is not lost.

In the TVP5020 video decoder of Texas Instruments Inc., the pixel clock frequency variations due to horizontal sync jitter are compensated by a feed forward term from the horizontal phase-lock loop to the color phase-lock loop. This term is a function of the inverse of the increment delta required by the horizontal PLL to maintain lock to the horizontal sync input as shown below.

$$inc_h = nom\_inc_{sc}/(1+\Delta_h/nom\_inc_h).$$

The inverse requires a division operation which results in a lot of computational overhead in either software or hardware to implement.

SUMMARY OF INVENTION

In accordance with one embodiment of the present invention variations in pixel clock frequency are compensated by the addition of the feed forward error to the color PLL increment delta.

In accordance with another embodiment of the present invention the feed forward error is a scaled version of the horizontal DTO increment delta which does not require division as implemented in the previous design. This results in greater accuracy.

In accordance with another embodiment of the present invention the scaling is implemented using adds and shifts.

DESCRIPTION OF PREFERRED EMBODIMENTS OF THE PRESENT INVENTION

A description of the horizontal phase locked loop for the TVP 5020 is found in the above-mentioned application Ser. No. 09/126,630 The present invention concerns a video decoder including a color phase lock loop which maintains lock of the local color oscillator with the color burst of the composite video input signal. The color phase-locked loop for the TVP 5020 is described in U.S. Pat. No. 6,330,034 entitled Color Phased-Locked Loop for Video Decoder". This patent is incorporated herein by reference. The TVP5020 utilizes a 24 bit accumulator and the resulting relationship between increment and pixel clock frequency $f_{pix}$ is shown below where the crystal oscillator frequency $f_{crystal}$ is 24.576 MHz for the 601 sampling rate and 26.8.MHz for the square pixel sampling rate. The horizontal DTO increment inc is a direct function of $f_{pix}$ which results in $$inc_h = 2^{23} * f_{pix}/f_{crystal}.$$

A color DTO increment $inc_{sc}$ which is a function of the inverse of the increment delta($\Delta h$) required by the horizontal PLL to maintain lock to the horizontal sync input is shown below $$inc_{sc} = nom\_inc_{sc}/(1+\Delta_h/nom\_inc_h).$$

This inverse requires a division operation which results in a lot of computational overhead to implement in either hardware or software to implement. This technique is described in the above-mentioned U.S. Pat. No. 6,330,034. This application is incorporated herein by reference. The horizontal phased-locked loop for this feed forward is described in the the above-mentioned application Ser. No. 09/126,630.

Figure 1:
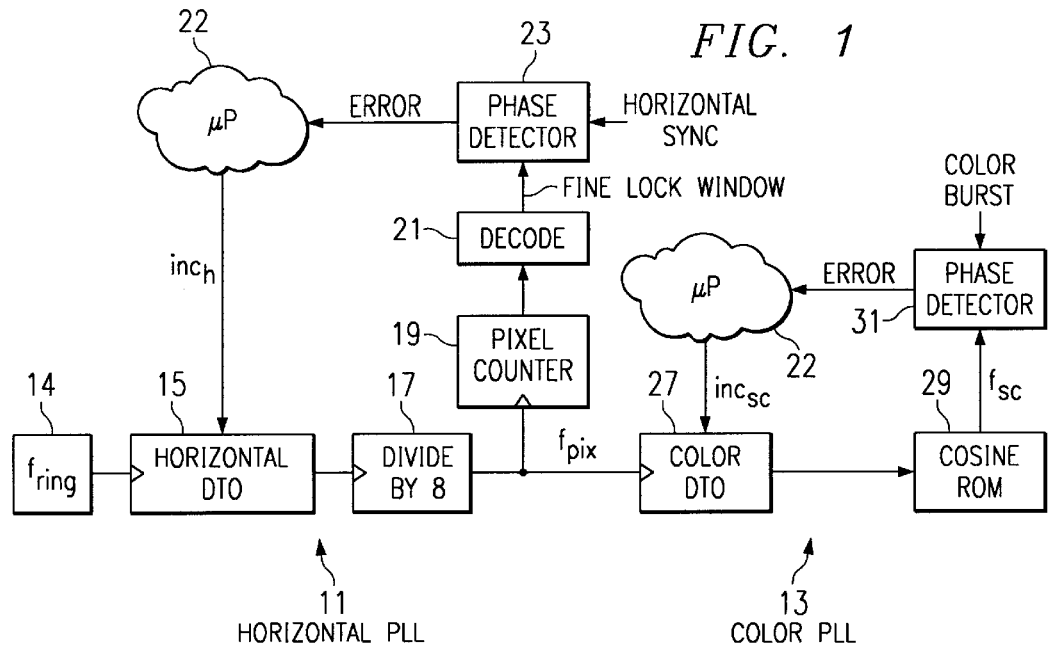
FIG. 1 is a block diagram of the horizontal PLL and color PLL system according to a preferred embodiment of the present invention.

Referring to FIG. 1 there is illustrated horizontal phase locked loop (PLL) 11 and color PLL 13 which are implemented in a combination of hardware and software according to a preferred embodiment of the present invention. The horizontal phased-locked loop is described in U.S. Pat. No. 6.329,850 entitled "Precision Frequency and Phase Synthesis". This patent is incorporated herein by reference. This horizontal DTO is a difference architecture that minimizes jitter. The horizontal discrete time oscillator (DTO) has a different increment/frequency from that in the TVP 5020 which is shown below where $f_{ring}$ is the ring oscillator frequency which is based on a crystal frequency=to $10*4*f_{sc}=14.31818$ MHz. The color subcarrier frequency $f_{sc}$ is 3.58 MHZ for NTSC.

$$inc = 2^{27}*(31/8*f_{ring}/f_{pix}+1).$$

There is an inverse relationship between the inc and $f_{pix}$ which results in a great simplification of the feed forward error correction obtained from the horizontal PLL fed to the color PLL. The horizontal discrete time oscillator(DTO) 15 is clocked by a constant frequency $f_{ring}$ from a ring oscillator 14. The ring oscillator frequency $f_{ring}$ is referenced to a crystal oscillator frequency $f_{ring}$ by the relation $f_{ring} = m*f_{crystal}$. Typical values are m=10 and $f_{crystal}=4*f_{sc}$ where $f_{sc}$ is the local color subcarrier oscillator frequency. The horizontal DTO 15 output frequency is divided down by 8 by divider 17 to produce the pixel clock frequency $f_{pix}$. A pixel counter 19 and decoder 21 are responsive to the $f_{pix}$ to produce a fine lock window signal which is then compared to the horizontal sync at phase detector 23 and any phase error is sent to the microprocessor 22. The decoder includes the coarse phase detector and fine phase detector described in the referenced horizontal phased-locked loops. The microprocessor 22 reads the horizontal phase error, filters it and writes an increment $inc_h$ value to the horizontal DTO 15 to maintain lock to the horizontal sync input. The pixel clock frequency $f_{pix}$, in turn, drives the color DTO 27 which generates the local oscillator frequency $f_{sc}$ via the cosine ROM 29. The local color oscillator frequency $f_{sc}$ and the received color burst are applied to the color phase detector 31 and the phase error is applied to the microprocessor 22. The microprocessor 22 reads the phase error between the color burst input and $f_{sc}$, filters it, and writes an increment $inc_{sc}$ value to the color DTO 27 to maintain lock to the color burst input. The following two equations relate the horizontal DTO 15 and color DTO 27 frequencies to their inputs.

$$inc_h = 2^{27}*(31/8*f_{ring}/f_{pix}+1)$$

$$inc_{sc} = 2^{24}*f_{sc}/f_{pix}$$

These two equations are combined to eliminate $f_{pix}$ and generate a result for $inc_{sc}$ as a function of $inc_h$.

$$inc_{sc} = 8/31*2^{24}*(2^{-27}*inc_h-1)*f_{sc}/f_{ring}$$

As the horizontal PLL 11 adjusts $inc_h$ varies about its nominal nom $inc_h$ by $\Delta_h$.

$$inc_h = nom\_inc_h + \Delta_h$$

Substitution for $inc_h$ results in the following.

$$inc_{sc}=nom\_inc_{sc}+1/31*f_{sc}/f_{ring}*\Delta_h$$

Figure 2:
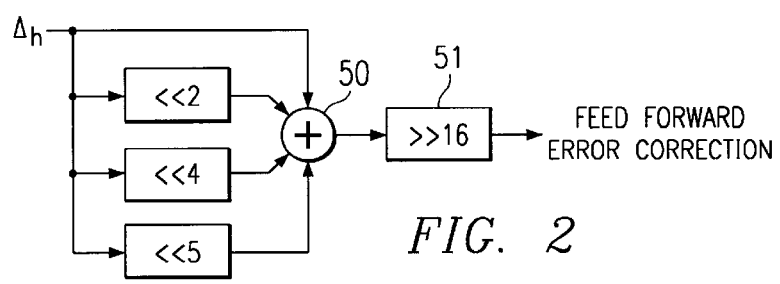
FIG. 2 illustrates an implementation of feed forward error using adds and shifts.

The feed forward error term from the horizontal PLL is $1/31*f_{sc}/f_{ring}*\Delta_h$. This represents the required adjustment to the color DTO 27 in order to maintain a constant $f_{sc}$. This relation requires only the addition of a scaled version of $\Delta_h$. For $f_{ring}=10*4*f_{sc}$ the feed forward scale factor can be approximated by $53/2^{16}$ which can be rewritten in binary as $11010_2$ right shifted 16 bits. FIG. 2 illustrates an implementation. Bits 1, 2, 4 and 5 are summed at summer 50 and right shifted 16 bits at shifter 51.

Figure 3:
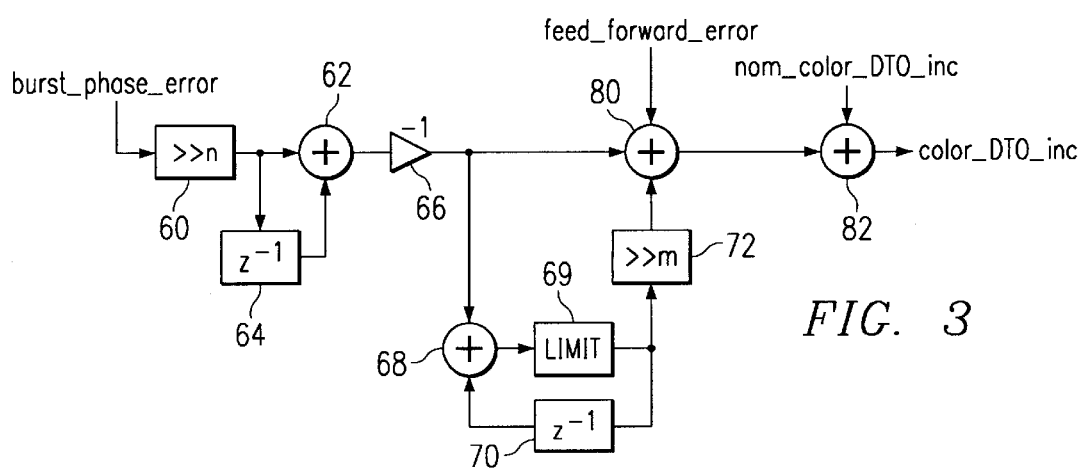
FIG. 3 is a block diagram of feed forward in color PLL processing.

FIG. 3 illustrates the application of the feed forward error in the color phase loop processing performed within the microprocessor 22 software where it is simply added to the color PLL increment delta of FIG. 1. The burst phase error, corresponding to a particular line of video, as determined by microprocessor 22 after processing some function of the filter output is right shifted n bits by microprocessor 22. The n bit shift is illustrated by block 60. This corresponds to multiplication by a proportional shift constant $k_p$. This result is added (represented by block 62) to a previous video line result (represented by block 64 and delay) corresponding to a previous burst error for the previous line. The resulting two line sum is negated (block 66). The negative two line sum is accumulated with summer 68, using a line delayed feedback loop that limits the summed results between positive and negative limits by virtue of block limit 69 and delay line block 70. The accumulated and limited sum is right shifted in bits by functional right shift block 72. This corresponds to multiplication by an integral constant $k_i$. The resulting product is added at adder 80 to the negative two line sum and to the scaled feed forward error (feed_forward_error) term from the horizontal PLL (for example $1/31*f_{sc}/f_{ring}*\Delta h$) as discussed above in connection with FIG. 2 for example. The feed forward error is a scaled version of the horizontal DTO increment that does not require division. The scaling can be implemented by adds and shifts. The sum of the functional adder 80 is added to the nominal color DTO increment (nom_color_DTO_inc) by functional adder 82. The variation in the pixel clock frequency are compensated by the addition of the feed forward error to the color PLL increment delta.

Although the present invention and its advantages have been described in detail, it should be understood that various changes substitutions and alterations can be made without departing from the spirit and scope of the invention as defined by the appended claims.

What is claimed:

1. A video decoder comprising:
   a horizontal phased locked loop including a horizontal discrete time oscillator,
   a color phased locked loop including a color discrete time oscillator generating a color local oscillator frequency $f_{sc}$, a comparator for comparing the color local oscillator frequency to a color burst to detect any error and a processing means to produce an color PLL nominal increment to the color discrete time oscillator,
   means for clocking the horizontal discrete time oscillator by a constant frequency, based on a crystal oscillator frequency $f_{crystal}$, from a ring oscillator $f_{ring}$ where $f_{ring}=m*f_{crystal}$ and $f_{crystal}=n*f_{sc}$, where m is a predetermined value for setting the frequency of the ring oscillator as a multiple of the crystal oscillator frequency and n is a predetermined value for setting the crystal oscillator frequency from the color local oscillator frequency,
   means for determining the horizontal phase error $\Delta h$ from the horizontal sync input and generating an increment $inc_h$ to the horizontal discrete time oscillator to maintain lock to the horizontal sync input,
   means for generating a scaled factor of phase error from the horizontal discrete time oscillator to maintain constant color local oscillator frequency without a division operation,
   means for adding said scaled factor of phase error to said color PLL nominal increment and feed forwarding to the color discrete time oscillator to maintain constant color local oscillator frequency.

2. The video decoder of claim 1 wherein said scaled factor is $1/31*f_{sc}/f_{ring}*\Delta h$.

3. The video decoder of claim 2 wherein $f_{ring}=40*f_{sc}$.

4. The video decoder of claim 1 wherein said scaled factor is provided by sums and shifts.

5. A video decoder of the type comprising a horizontal phase locked loop including means for determining phase error $\Delta h$ from the horizontal sync input and the horizontal oscillator frequency and generating an increment to the horizontal oscillator to maintain lock to the horizontal sync input and a color phased locked loop including a local color oscillator and means for determining phase error between the local color oscillator frequency $f_{sc}$ and a color burst input to generate a color correcting increment to the color oscillator to maintain lock to the color burst and wherein said the color local oscillator is derived from the horizontal oscillator frequency $f_{ring}$, the improvement comprising:
   means for generating a scaled factor of the phase error from the horizontal oscillator without a division operation, and
   means for adding to the said color correcting increment the scaled factor of the phase error from the horizontal oscillator and feed forwarding the result to the color oscillator.

6. The video decoder of claim 5 wherein said scaled factor is $1/31*f_{sc}/f_{ring}*\Delta h$.

7. The video decoder of claim 6 wherein $f_{ring}=40*f_{sc}$.

* * * * *